United States Patent [19]
Richardson et al.

[11] Patent Number: 5,345,459
[45] Date of Patent: Sep. 6, 1994

[54] METHOD OF REDUCING THE THERMALLY-INDUCED SHIFT IN THE EMISSION WAVELENGTH OF LASER DIODES

[75] Inventors: Bruce A. Richardson, Nepean; Douglas J. S. Beckett; Jozef Finak, both of Kanata; Robert A. Bruce, Stittsville; David M. Adams, Gloucester, all of Canada

[73] Assignee: Northern Telecom Limited, Montreal, Canada

[21] Appl. No.: 118,273

[22] Filed: Sep. 9, 1993

[51] Int. Cl.[5] .............................................. H01S 3/04
[52] U.S. Cl. ...................................... 372/34; 372/96; 372/44; 372/26
[58] Field of Search ...................... 372/34, 96, 26, 44, 372/46, 45

[56] References Cited

U.S. PATENT DOCUMENTS

| 4,751,719 | 6/1988 | Mito et al. | 372/96 |
| 4,869,568 | 9/1989 | Schimpe | 372/44 |
| 5,170,402 | 12/1992 | Ogita et al. | 372/26 |
| 5,274,225 | 12/1993 | Gorfinkel et al. | 372/34 |

FOREIGN PATENT DOCUMENTS 0266489  11/1991  Japan ..................................... 372/96

Primary Examiner—Georgia Y. Epps
Attorney, Agent, or Firm—George MacGregor

[57] ABSTRACT

A method of reducing thermally-induced emission wavelength shift in laser diodes. In addition to the conventional ridge contact for supplying the modulation current to the laser diode a second ridge contact is formed on the device. A compensation current of substantially the same frequency as the modulation current but having an opposite phase is applied to the second contact. This compensation current is selected to substantially neutralize the transient temperature variations due to changes in the modulation signal and result in a generally steady state thermal situation.

13 Claims, 3 Drawing Sheets

METHOD OF REDUCING THE THERMALLY-INDUCED SHIFT IN THE EMISSION WAVELENGTH OF LASER DIODES

FIELD OF THE INVENTION

This invention relates to semiconductor injection laser diodes for use in fibre-optic-cable based transmission systems and in particular to a method of reducing thermally-induced emission wavelength shift in such diodes.

BACKGROUND OF THE INVENTION

The semiconductor injection laser has gained a prominent position as the energy source for use in fibre optic communication systems. By selecting the appropriate semiconductor materials, conventionally III-V alloys, and through material processing and device fabrication techniques a range of laser diodes may be constructed which emit radiation in substantially the entire wavelength band of 0.8 to 1.7 $\mu$m. Of particular interest are laser diodes which emit in the 1.3 to 1.55 $\mu$m wavelength region as these are better matched to low attenuation fibre optic cables for high performance long distance transmission.

Diode lasers are conventionally fabricated in Fabry-Perot cavity designs or distributed feedback (DFB) configurations. The latter are better suited to optical communication systems in as much as they suffer less dispersion penalty due to their narrower optical spectrum.

Thermal considerations with respect to diode lasers have tended to concentrate on steady state issues such as mounting configurations, type of solder used and heat-sink materials. In long haul communication systems wherein accurate wavelength control is critical, however, wavelength shift due to transient temperature changes in the active region becomes an important consideration. Both Fabry-Perot and DFB type lasers are subject to changes in emission wavelength as a result of such temperature variations although DFB lasers are less prone to wavelength shift. This is because the shift in Fabry-Perot lasers follow the temperature dependence of the energy gap of the diode material which is greater than the temperature dependence of the refractive index, the influencing factor in DFB lasers. By way of example the typical wave length shift with temperature for a DFB laser may be as much as 0.08 nm per degree K while the shift for an Fabry-Perot type laser diode may be 0.6 nm per degree K. In any event, the emission wavelength of either type of laser will under go a shift to a lower or higher frequency as the device temperature increases or decreases respectively. From a practical point of view, a wavelength shift of approximately 1 Angstrom may be observed after a time of approximately 100 ns when the diode drive current to a DFB laser is increased by approximately 40 mA. This wavelength shift in combination with the inherent chromatic dispersion of a standard fibre causes difficulties in a fibre-optic-cable transmission system. For example, the shift in wavelength of a DFB laser operating at a nominal wavelength of 1.55 $\mu$m can result in a variation in the delay of approximately 150 ps in the arrival time for a signal having travelled 100 km through a standard fibre.

SUMMARY OF THE INVENTION

Accordingly, it is an object of the present invention to reduce the shift in the emission wavelength of a laser diode due to temperature variations in the diode o caused by changes in signal modulation current.

Therefore, in accordance with a first aspect of the invention there is provided a method of reducing the aforementioned, thermally induced emission wavelength shift in a laser diode having a first contact for receiving the signal modulation current. The method comprises providing a compensating modulation current to a second contact located in close proximity to the first contact. The compensating modulation current has a phase which is opposite to the phase of the signal modulation current and an amplitude such that temperature variations due to changes in the signal modulation current are substantially neutralized by changes in the power dissipated in the diode due to the compensation signal. Thus, a near steady state temperature condition is established.

According to another aspect of the invention there is provided a laser diode having compensating means to reduce the thermally-induced shift in emission wavelength due to a temperature variations caused by changes in the signal modulation current applied to a laser input contact. The compensating means comprises a second contact located in close proximity to the input contact and is adapted to receive a compensating modulation current having a phase which is opposite to the phase of the signal modulation current and an amplitude selected such that temperature variations due to changes in the signal modulation current are substantially neutralized by changes in the power dissipated in the diode due to the compensating modulation current.

BRIEF DESCRIPTION OF THE DRAWINGS

Aspects of the invention will now be described with referenced to the appended drawings in which.

DETAILED DESCRIPTION OF THE INVENTION

Figure 1:
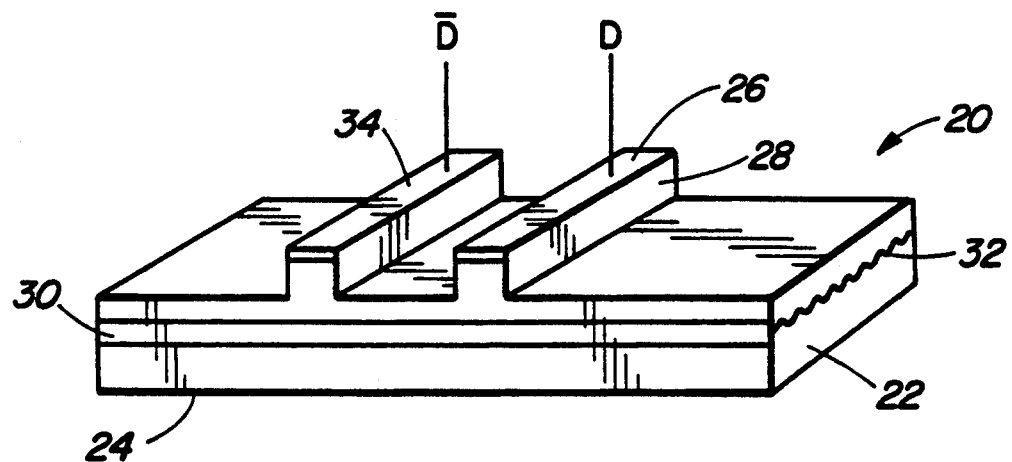
FIG. 1 is a perspective view of a diode laser with input and compensating contacts.

FIG. 1 illustrates in a simplified manner a ridge waveguide, distributed feedback diode laser 20 fabricated on an InP substrate 22 and tailored to emit energy having a wavelength in the 1.55 $\mu$m range. The device has a common N contact 24 which in this case is the bottom contact and is attached to a heat sink (not shown) in any conventional manner consistent with laser fabrication technology. A ridge contact 26 on the P side 28 of the device is connected to the D.C. bias and the input modulation signal which provides the laser pumping current. Lasing occurs in the active area 30 under the contact as is well known in the art and need not be described in detail here. An optical grating 32 incorporated into the structure provides periodic variations in refractive index along the direction of wave propagation so that the feedback necessary to produce amplification is achieved. For the sake of simplification a DFB laser is illustrated but it is to be understood that the principles of the invention apply as well to a Fabry-Perot type structure.

As shown in FIG. 1, and in accordance with one aspect of the invention, the laser diode 20 is provided with a second ridge contact 34 adjacent the input contact 26. Although in FIG. 1 the second contact 34 has the same general dimensions as the input contact 26 this is not essential as will be discussed later. The second contact 34 is generally parallel to and situated a few $\mu$m from the input contact 26, the distance being in the range 3 $\mu$m to 4 $\mu$m.

Figure 5A:
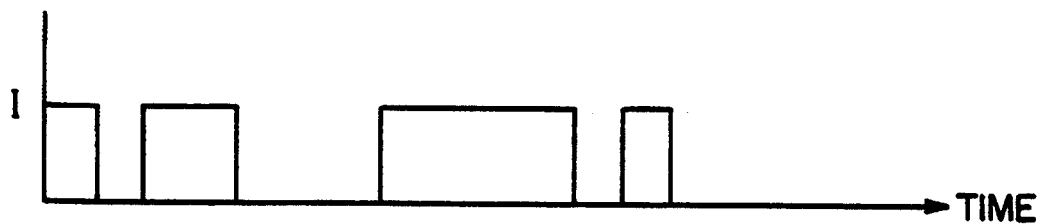
FIGS. 5a to 5d are diagrams illustrating current and temperature relationships according to the invention.
Figure 5B:
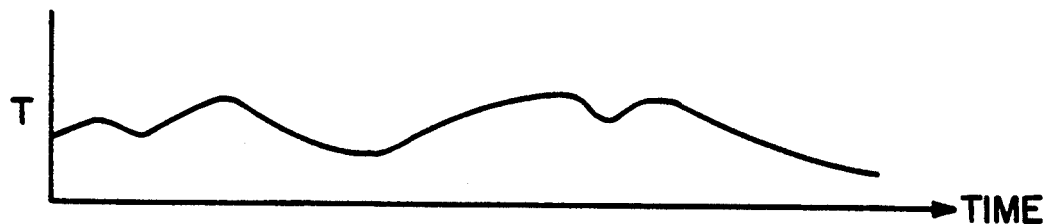
Figure 5C:
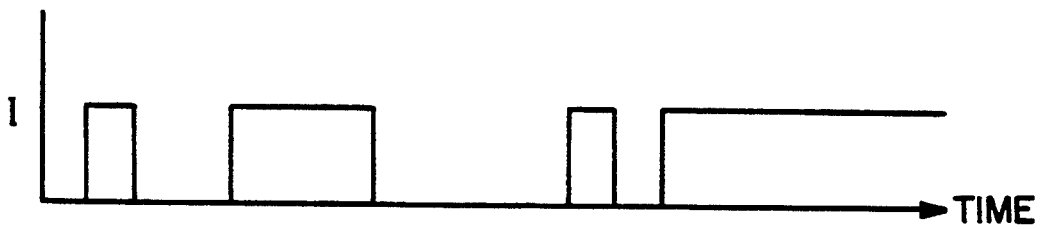
Figure 5D:
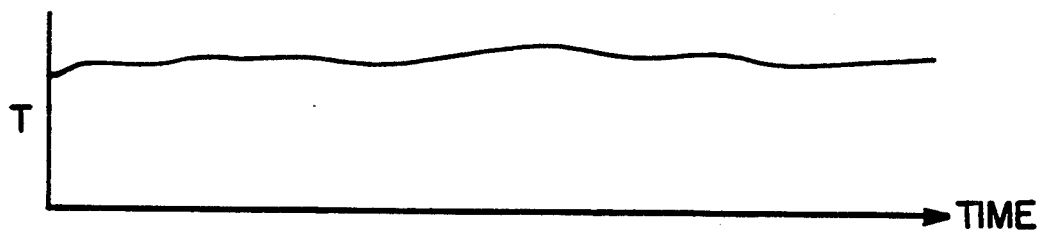

In carrying out the preferred embodiment of the present invention the second contact 34 is supplied with a compensating modulation current which is out of phase with the signal modulation current. The compensating signal, which may or may not include a D.C. bias, has a pulse height tailored such that the power dissipated in the laser diode due to the compensating current substantially neutralizes the temperature variation in the active region due to the signal current. Preferably, the phase difference is 180 degrees so that the two signals are directly opposite. This arrangement is best suited to optimize heating effects in order to balance the variations in active region temperature caused by duty cycle variations in the data (for example the SONET header portion of the on-off bit stream). Hence, for practical purposes a near steady state temperature condition is established. This near steady state temperature is higher than the average temperature of the device without the compensating signal but temperature variations are significantly reduced as is the thermally-induced emission wavelength shift. In view of the phase relationship between the two signals, the laser is supplied with an input signal essentially 100% of the time and the steady state operating temperature is about two times the laser temperature at threshold. This input relationship will be better understood with reference to the waveforms depicted in FIGS. 5a to 5d. FIG. 5a is an example of an input modulating current. FIG. 5b illustrates a relative profile of temperature variations of the laser due to the current of FIG. 5a. FIG. 5c represents the waveform of the compensating signal as applied to the second contact in accordance with the invention. FIG. 5d shows the resulting temperature profile. It may be noted that the total temperature excursion is reduced while the average temperature is increased.

Figure 4A:
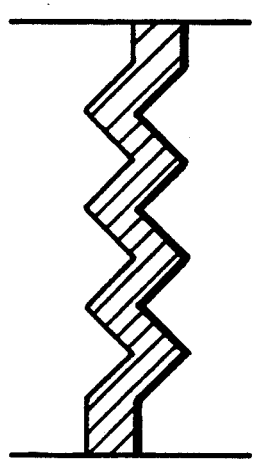
FIGS. 4a to 4c are plan views of possible, alternate contact configurations.
Figure 4B:
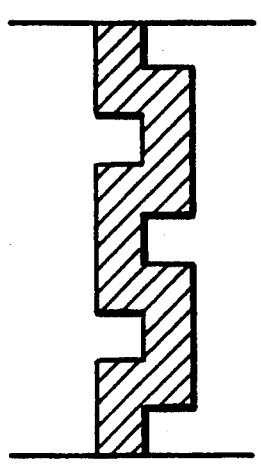
Figure 4C:
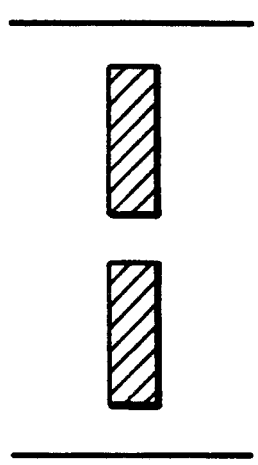

As illustrated in FIG. 1 the second contact 34 is also directly over the active region 30 and this may lead to lasing action by the compensating modulation signal. This is not necessarily desired and the geometry of the second contact may take on a different configuration in an attempt to avoid lasing. Alternate contact configurations are shown in FIGS. 4a–4c. These include a zig-zag pattern (FIG. 4a), an off-set pattern (FIG. 4b) and an interrupted pattern (FIG. 4c). The close proximity of a second metal contact and/or the lack of lateral index guiding from one of the alternate contact configurations contribute to the prevention of lasing.

Obviously, the closer the second contact is to the input contact the more effective the balancing process will be. There are of course practical limits which must be taken into consideration. For example, it is known that less than 1 part per million of the laser optical mode power extends beyond 3 $\mu$m in the lateral direction and hence a contact spacing in the range 3 $\mu$m to 4 $\mu$m is considered to be a good compromise.

Figure 2:
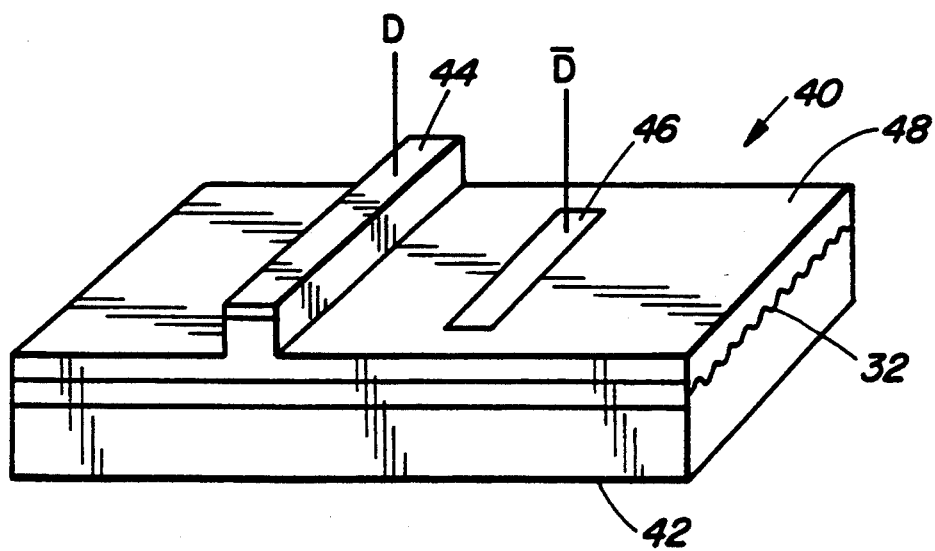
FIG. 2 is a perspective view of an alternate embodiment of the structure of FIG. 1.

Under certain operating conditions it may be necessary to generate the increase in transient temperature by means other than the single compensating ridge contact. FIG. 2 illustrates an alternate embodiment which accommodates this requirement. In this case the laser diode 40 has a common N contact 42 as previously discussed and a P type ridge contact 44 as before. As illustrated in this figure the compensating contact 46 is situated directly on the InP semiconductor layer 48. In the circumstance, this contact (for example TiPtAu) is non-ohmic and hence has substantial resistance and therefor a greater voltage drop which has the effect of generating more heat from the same compensating modulation current.

Figure 3:
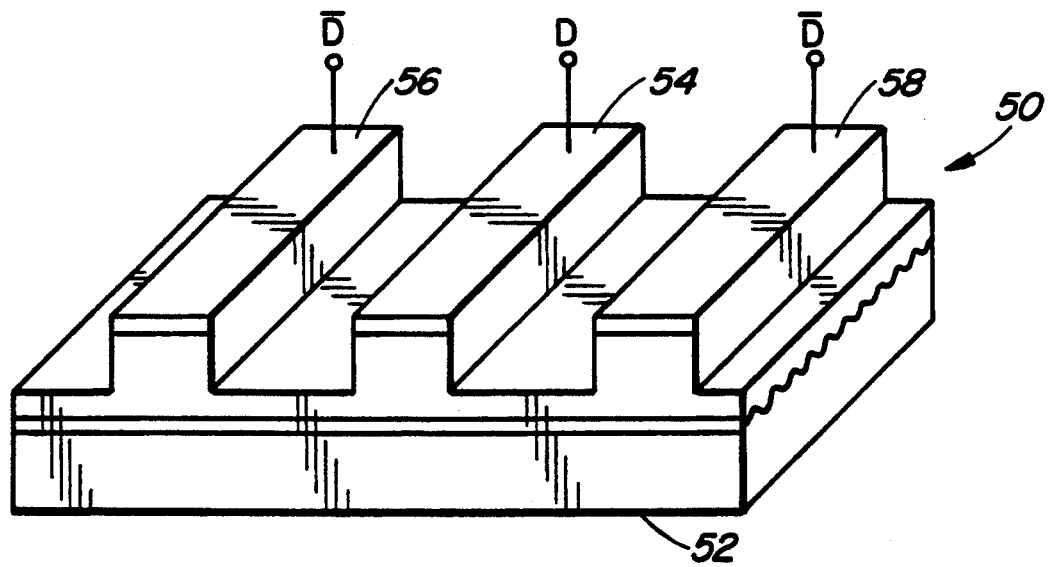
FIG. 3 is a perspective view of a laser diode structure having double compensating contacts.

A further variation of the means to compensate for the thermally induced wavelength shift is illustrated in FIG. 3. In this embodiment the diode 50, has a common N contact 52 and P ridge contact 54 as in the previous architecture. In this case, however, a second compensation contact 58 is positioned adjacent the input contact 54 and on the side of the input contact opposite to the first compensating contact 56. The compensating modulation current is applied to both compensation contacts 56, 58 in order to increase the overall thermal effect. Of course, one or both of the pair of compensation contacts of FIG. may be non-ohmic as shown in FIG. 2.

While particular embodiments of the invention have been described it is to be understood that variations can be effected without departing from the scope of the invention as defined in the following claims.

I claim:

1. A method of reducing thermally-induced shift in the emission wavelength of a laser diode in which the wavelength shift is caused by a temperature change in the diode due to a signal modulation current, the laser diode having a first contact for receiving said signal modulation current; the method comprises providing a compensating modulation current to a second contact in juxtaposition to said first contact, said compensating modulation current being out of phase with said signal modulation current, and having an amplitude such that temperature variations due to changes in the signal modulating current are substantially neutralized by the power dissipated in said diode due to said compensating modular ion current.

2. A method according to claim 1, the compensating modulation current being approximately 180 degrees out of phase with the signal modulation current.

3. A method as defined in claim 1 wherein said first and second contacts are ridge contacts.

4. A method as defined in claim 3 wherein said second contact is laterally separated from said first contact by a distance in the range 3 $\mu$m to 4 $\mu$m.

5. A method as defined in claim 1, the second contact having a zig-zag geometry.

6. A method as defined in claim 1, the second contact having a lateral off-set geometry.

7. A method as defined in claim 1, the second contact geometry being interrupted.

8. In a laser diode having a top ridge contact to which a signal modulation current is supplied, a method of reducing thermally-induced shift in the emission wavelength of the laser due to a temperature increase caused by the signal modulation current, the method comprising providing a second ridge contact located in close proximity to the top ridge contact, the second ridge contact being supplied with a compensating modulation current having a phase which is opposite of the signal modulation current so that the power dissipated by the compensating modulation current generates a temperature increase which substantially neutralizes the temperature increase due to the signature modulation current.

9. A laser diode having compensating means to reduce the thermally-induced shift in emission wavelength due to temperature variations caused by changes in the signal modulation current applied to an input contact on said laser, said compensating means comprising a second contact located in close proximity to the input contact and adapted to receive a compensating modulation current having a phase which is opposite to the phase of the signal modulation current and an amplitude such that temperature variations due to changes in said signal modulation current are substantially neutralized by the power dissipated in said diode by said compensating modulation current.

10. A laser diode as defined in claim 9, the laser input contact and the second contact being ridge shaped and generally parallel to each other.

11. A laser diode as defined in claim 10, the laser input contact and the second contact being separated by a distance in the range of 3 $\mu$m to 4 $\mu$m.

12. A laser diode as defined in claim 10 having a third ridge contact generally parallel to and adjacent the laser input contact.

13. A laser as defined in claim 10, the second contact being non-ohmic.

* * * * *